(12) United States Patent
Suzuki et al.

(10) Patent No.: US 10,297,317 B2
(45) Date of Patent: May 21, 2019

(54) NON-VOLATILE SEMICONDUCTOR MEMORY DEVICE INCLUDING CLAMP CIRCUIT WITH CONTROL TRANSISTOR AND AMPLIFIER CIRCUIT

(71) Applicant: Toshiba Memory Corporation, Tokyo (JP)

(72) Inventors: Yoshinori Suzuki, Kawasaki Kanagawa (JP); Takayuki Miyazaki, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/694,955

(22) Filed: Sep. 4, 2017

(65) Prior Publication Data

US 2018/0268898 A1    Sep. 20, 2018

(30) Foreign Application Priority Data

Mar. 16, 2017  (JP) .................................. 2017-051294

(51) Int. Cl.
*G11C 13/00* (2006.01)

(52) U.S. Cl.
CPC ........ *G11C 13/004* (2013.01); *G11C 13/0023* (2013.01); *G11C 13/0069* (2013.01)

(58) Field of Classification Search
CPC .............. G11C 13/004; G11C 13/0004; G11C 13/0069; G11C 13/0026; G11C 2013/0045; G11C 13/0023
See application file for complete search history.

(56) References Cited

U.S. PATENT DOCUMENTS

| 7,633,809 B2 | 12/2009 | Kajiyama |
| 8,416,602 B2 | 4/2013 | Kitagawa et al. |
| 8,929,125 B2 | 1/2015 | Keeth et al. |
| 9,343,148 B2 | 5/2016 | Papandreou et al. |

(Continued)

FOREIGN PATENT DOCUMENTS

| JP | 2007141399 A | 6/2007 |
| JP | 2011165297 A | 8/2011 |

(Continued)

OTHER PUBLICATIONS

Taiwan Office Action dated Feb. 9, 2018, filed in Taiwan counterpart Application No. 106124701, 8 pages (with translation).

*Primary Examiner* — David Lam
(74) *Attorney, Agent, or Firm* — Kim & Stewart LLP

(57) ABSTRACT

A non-volatile semiconductor memory device includes a current source providing a reference current to a first node and a clamp circuit. The clamp circuit includes a transistor having a current path between the first node and a second node, and an amplifier circuit having a first input port at which a cell reference voltage can be received, a second input port connected to the second node, and an output port connected to a control terminal of the transistor. The amplifier circuit is configured to output a differentially amplified signal from the output port. A memory cell is connected between a bit line and a word line and includes a variable resistance element. The bit line can be connected to the second node. A sense amplifier is connected to the first node to detect data stored in the memory cell.

20 Claims, 12 Drawing Sheets

10··· CONTROL CIRCUIT
12··· WORD LINE SELECTION CIRCUIT
14··· MEMORY CELL ARRAY
16··· INPUT/OUTPUT CIRCUIT
200··· HOST
11··· DECODER/DRIVER CIRCUIT
13··· BIT LINE SELECTION CIRCUIT
15··· WRITE/READ CIRCUIT
100··· NON-VOLATILE SEMICONDUCTOR MEMORY DEVICE

(56) References Cited

U.S. PATENT DOCUMENTS

| | | | |
|---|---|---|---|
| 2009/0001959 A1* | 1/2009 | Tang | G05F 3/262 |
| | | | 323/315 |
| 2011/0199812 A1 | 8/2011 | Kitagawa et al. | |
| 2011/0222355 A1* | 9/2011 | Nakashima | G11C 13/004 |
| | | | 365/189.09 |
| 2012/0314481 A1 | 12/2012 | Close et al. | |
| 2015/0262629 A1 | 9/2015 | Cho et al. | |
| 2016/0125937 A1 | 5/2016 | Kang | |
| 2016/0172026 A1* | 6/2016 | Lee | G11C 13/004 |
| | | | 365/148 |

FOREIGN PATENT DOCUMENTS

| | | |
|---|---|---|
| JP | 2015109120 A | 6/2015 |
| JP | 2016515277 A | 5/2016 |

\* cited by examiner

10··· CONTROL CIRCUIT
12··· WORD LINE SELECTION CIRCUIT
14··· MEMORY CELL ARRAY
16··· INPUT/OUTPUT CIRCUIT
200··· HOST

11··· DECODER/DRIVER CIRCUIT
13··· BIT LINE SELECTION CIRCUIT
15··· WRITE/READ CIRCUIT
100··· NON-VOLATILE SEMICONDUCTOR
       MEMORY DEVICE

FIG. 2

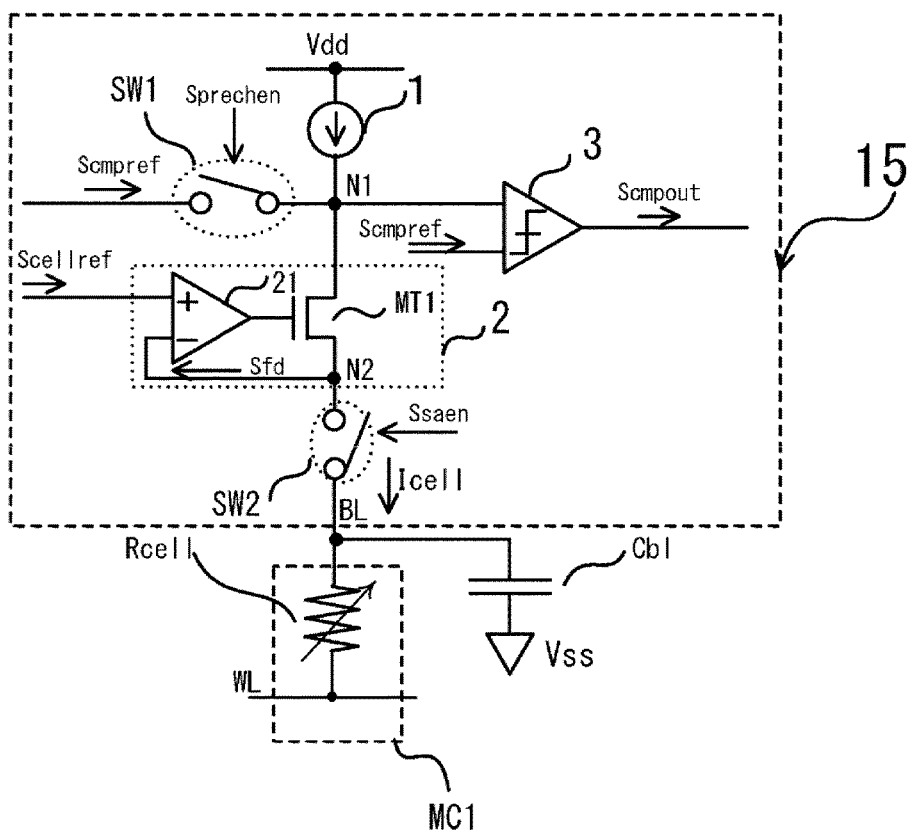

1 ··· CURRENT SOURCE
3 ··· SENSE AMPLIFIER
BL ··· BIT LINE
Icell ··· CELL CURRENT
MT1 ··· CONTROL TRANSISTOR
Rcell ··· VARIABLE RESISTANCE ELEMENT
Scmpout ··· SENSE AMPLIFIER OUTPUT SIGNAL
Sfd ··· FEEDBACK SIGNAL
SW1、SW2 ··· SWITCH
Vss ··· LOW POTENTIAL SIDE POWER SUPPLY (GROUND VOLTAGE)

2 ··· CLAMP CIRCUIT
21 ··· AMPLIFIER CIRCUIT
Cbl ··· BIT LINE LOAD CAPACITANCE
MC1 ··· MEMORY CELL
N1、N2 ··· NODE
Scellref ··· CELL REFERENCE SIGNAL
Scmpref ··· SENSE AMPLIFIER REFERENCE SIGNAL
Sprechen、Ssaen ··· CONTROL SIGNAL
Vdd ··· HIGH POTENTIAL SIDE POWER SUPPLY
WL ··· WORD LINE Cbla、Cblb ··· BIT LINE LOAD CAPACITANCE    D1 ··· DIODE
MC2、MC3 ··· MEMORY CELL    MT2 ··· CONTROL TRANSISTOR Icellref ··· REFERENCE CURRENT
Icellrf ··· REFERENCE REFERENCE CURRENT
PMT1, PMT2 ··· P-channel MOS TRANSISTOR

C1 ··· CAPACITOR
SW3 ··· SWITCH

INV1 ··· INVERTER

Vcellref ··· CELL REFERENCE VOLTAGE
Vsense ··· DETECTION VOLTAGE
T11 ··· CHARGING TIME 3a ··· SENSE AMPLIFIER
Sclmp ··· CONTROL SIGNAL
SW11 ··· SWITCH 15a ··· WRITE/READ CIRCUIT
Seqen ··· EQUALIZE SIGNAL 4 ··· DETERMINATION CIRCUIT
151 ··· WRITE/READ CIRCUIT
MC1n ··· MEMORY CELL
Scellrefx ··· CELL REFERENCE SIGNAL

5 ··· DA CONVERTER

Rcelln ··· VARIABLE
          RESISTANCE ELEMENT

US 10,297,317 B2

NON-VOLATILE SEMICONDUCTOR MEMORY DEVICE INCLUDING CLAMP CIRCUIT WITH CONTROL TRANSISTOR AND AMPLIFIER CIRCUIT

CROSS-REFERENCE TO RELATED APPLICATION

This application is based upon and claims the benefit of priority from Japanese Patent Application No. 2017-051294, filed Mar. 16, 2017, the entire contents of which are incorporated herein by reference.

FIELD

Embodiments described herein relate generally to a non-volatile semiconductor memory device.

BACKGROUND

A resistive random access memory (ReRAM), a phase-change random access memory (PCRAM), and a magneto-resistive random access memory (MRAM) each include a variable resistance element of some type in each memory cell. These various memory types are being developed as next generation nonvolatile semiconductor memory devices.

DESCRIPTION OF THE DRAWINGS

FIG. 2 is a circuit diagram illustrating a write/read circuit in a first embodiment.

DETAILED DESCRIPTION

In general, according to one embodiment, A non-volatile semiconductor memory device includes a current source providing a reference current to a first node and a clamp circuit including: a control transistor having a current path with a first end connected to the first node and a second end connected to a second node, and an amplifier circuit with a first input port at which a cell reference voltage can be received, a second input port connected to the second node, and an output port connected to a control terminal of the control transistor, the amplifier circuit being configured to output a differentially amplified signal from the output port. A memory cell is connected between a bit line and a word line and includes a variable resistance element. The bit line is connectable to the second node. A sense amplifier is connected to the first node and is configured to detect a data value stored in the memory cell according to a resistance level of the variable resistance element.

Hereinafter, example embodiments will be described with reference to the drawings.

First Embodiment

Figure 1:
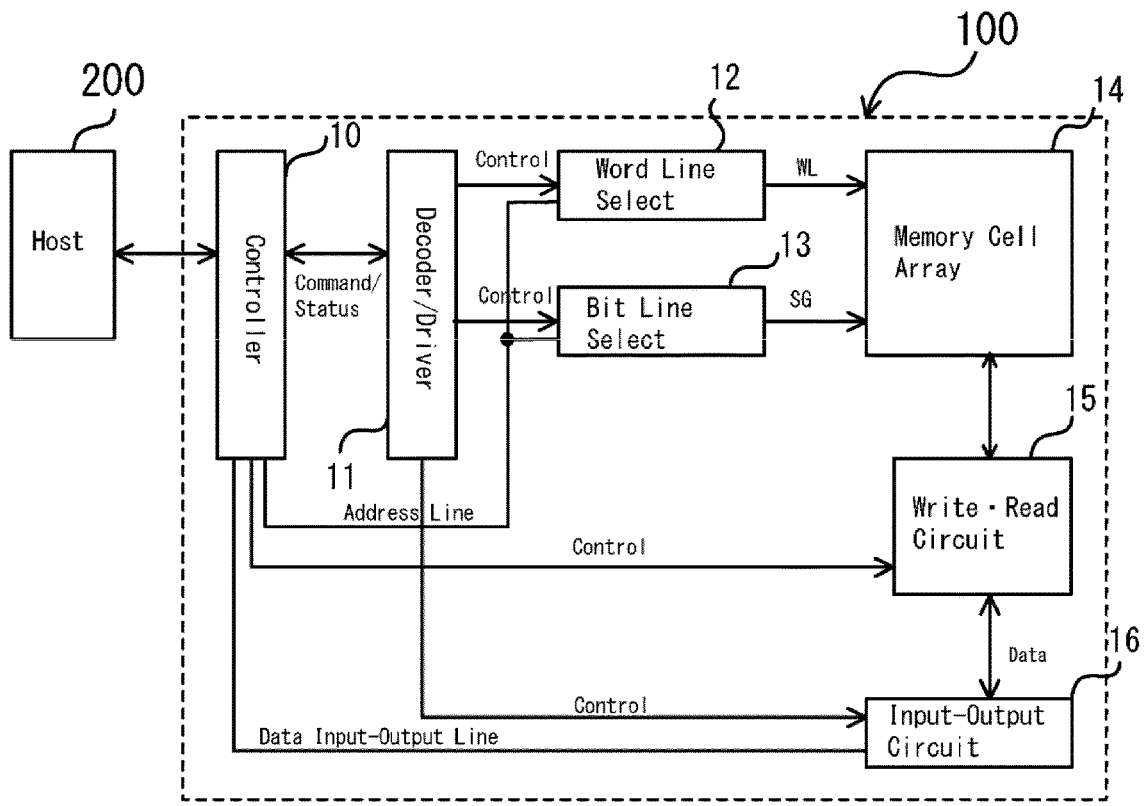
FIG. 1 is a block diagram illustrating a non-volatile semiconductor memory device in a first embodiment.

First, a non-volatile semiconductor memory device in a first embodiment will be described with reference to the drawings. FIG. 1 is a block diagram illustrating a non-volatile semiconductor memory device. In the first embodiment, a reading time is minimized by charging a bit line load capacitor at high speed using a clamp circuit that includes a control transistor and an amplifier circuit.

As illustrated in FIG. 1, the non-volatile semiconductor memory device 100 includes a control circuit 10, a decoder/driver circuit 11, a word line selection circuit 12, a bit line selection circuit 13, a memory cell array 14, a write/read circuit 15, and an input/output circuit 16. The non-volatile semiconductor memory device 100 is a resistive random access memory (ReRAM), which is a resistive changing memory type. The non-volatile semiconductor memory device 100 exchanges various information items with host 200.

The control circuit 10 receives from host 200 a request for writing data or a request for reading data. The control circuit 10 exchanges command/status information with the decoder/driver circuit 11. The control circuit 10 transmits address information to the word line selection circuit 12 via an address line. The control circuit 10 also transmits address information to the bit line selection circuit 13 via the address line. The control circuit 10 transmits control signals for writing, pre-charging, reading, and like to the write/read circuit 15. The control circuit 10 exchanges data with the input/output circuit 16 via a data input-output line. The control circuit 10 transmits data from the input/output circuit 16 to the host 200.

The decoder/driver circuit 11 transmits a control signal to the word line selection circuit 12. The decoder/driver circuit 11 transmits a control signal to the bit line selection circuit 13. The word line selection circuit 12 selects a word line based on the control signal from the decoder/driver circuit 11 and the address information from the control circuit 10. The bit line selection circuit 13 selects a bit line based on the control signal from the decoder/driver circuit 11 and the address information from the control circuit 10.

The memory cell array 14 includes a plurality of memory cells, a plurality of word lines, and a plurality of bit lines three dimensionally arrayed.

The write/read circuit 15 performs writing, pre-charging, and reading to and from the memory cell based on the control signal from the control circuit 10. The input/output circuit 16 exchanges data with the write/read circuit 15.

As illustrated in FIG. 2, the write/read circuit 15 includes a current source 1, a clamp circuit 2, a sense amplifier 3, a switch SW1, and a switch SW2. The write/read circuit 15 is connected to a memory cell MC1 via a bit line BL.

In this example, the memory cell MC1 includes a variable resistance element Rcell that operates to store one of two possible values (a value associated with a high resistance state and a value associated with a low resistance state). One end of the variable resistance element Rcell is connected to a bit line BL and the other end is connected to a word line WL. A bit line load capacitor Cbl can be considered to be formed between the bit line BL and a low potential side power supply (ground potential) Vss. The bit line load capacitor Cbl is also called as "a bit line parasitic capacitance."

One end of the current source 1 is connected to a high potential side power supply Vdd and the other end is connected to a node N1. A sense amplifier reference signal "Scmpref" (hereinafter, sense amplifier reference signal Scmpref) is input to one end of the switch SW1 and the other end of the switch SW1 is connected to the node N1. The switch SW1 enters an ON state when the control signal "Sprechen" (hereinafter control signal Sprechen) indicates an enable state, and transmits the sense amplifier reference signal Scmpref to the node N1 when closed.

The clamp circuit 2 includes a control transistor MT1 and an amplifier circuit 21. The control transistor MT1 is an N-channel MOS transistor. One end (e.g., drain) of the control transistor MT1 is connected to the node N1, a control terminal (e.g., gate) thereof is connected to an output side of the amplifier circuit 21, and the other end (e.g., source) thereof is connected to the node N2.

During a reading operation of the memory cell MC1, a cell current Icell flows in the bit line BL.

The amplifier circuit 21 is a negative feedback differential amplifier circuit operating at a high speed and a high gain. A cell reference signal "Scellref" (hereinafter cell reference signal Scellref) is input to a positive (+) port of the input side of the amplifier circuit 21 and a negative (−) port of the input side thereof is connected to the node N2. The amplifier circuit 21 compares the cell reference signal Scellref with a feedback signal Sfd, fed back from the node N2, and outputs a comparison amplified signal to the control terminal of the control transistor MT1.

One end of the switch SW2 is connected to the node N2 and the other end is connected to the memory cell MC1 via the bit line BL. The switch SW2 can be, for example, a multiplexer, and operates to connect the node N2 and the bit line BL to each other when the control signal Ssaen is in the enable state.

Voltage information, also referred to as the detection voltage, of the node N1 and the sense amplifier reference signal Scmpref are input to an input side of the sense amplifier 3. Then, the sense amplifier 3 detects data value stored in the variable resistance element Rcell of the memory cell MC1 and outputs the detected data as sense amplifier output signal Scmpout.

In the first embodiment, a memory cell with just a variable resistance element Rcell is used as the memory cell MC1. However, the memory cell MC2 illustrated in FIG. 3A or the memory cell MC3 illustrated in FIG. 3B may be used in place of the memory cell MC1.

Figure 3A:
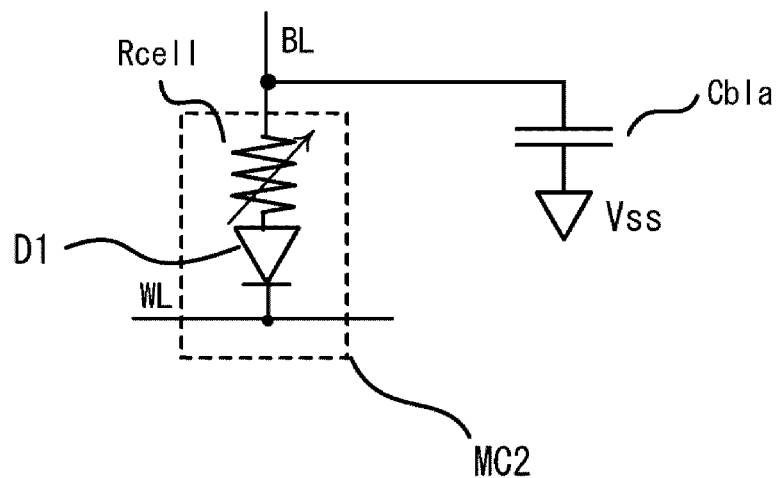
FIG. 3A and FIG. 3B are circuit diagrams illustrating memory cells in a modification example of a first embodiment.

As illustrated in FIG. 3A, the memory cell MC2 includes a variable resistance element Rcell and a diode D1. One end of the variable resistance element Rcell is connected to the bit line BL. An anode of the diode D1 is connected to the other end of the variable resistance element Rcell, and a cathode of the diode D1 is connected to the word line WL. A bit line load capacitor Cbla is considered to be formed between the bit line BL and the low potential side power supply (e.g., ground potential).

Figure 3B:
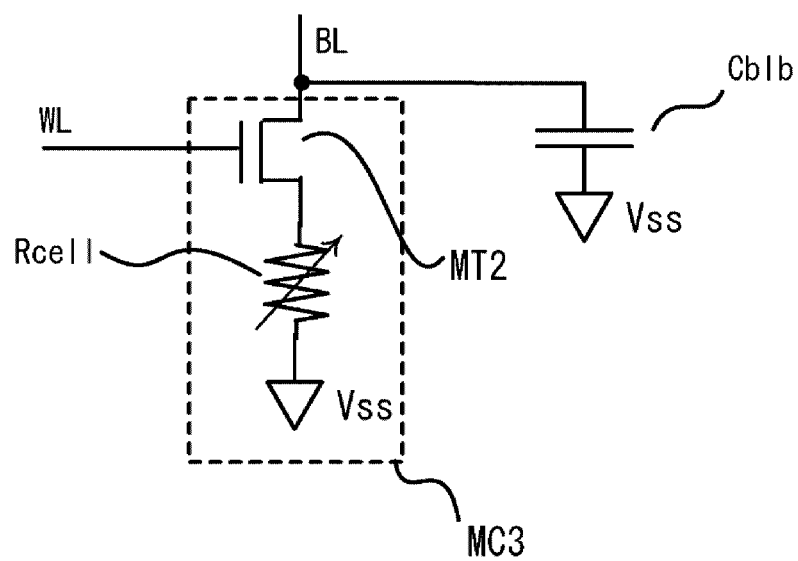

As illustrated in FIG. 3B, the memory cell MC3 includes a control transistor MT2 and a variable resistance element Rcell. The control transistor MT2 is an N-channel MOS transistor. One end (e.g., drain) of the control transistor MT2 is connected to the bit line BL and a control terminal (e.g., gate) thereof is connected to the word line WL. One end of the variable resistance element Rcell is connected to the other end (e.g., source) of the control transistor MT2 and the other end thereof is connected to the low potential side power supply. A bit line load capacitor Cblb is considered to be formed between the bit line BL and the low potential side power supply. The bit line load capacitor Cbl has a relatively large value of several picofarads in this example.

Figure 4:
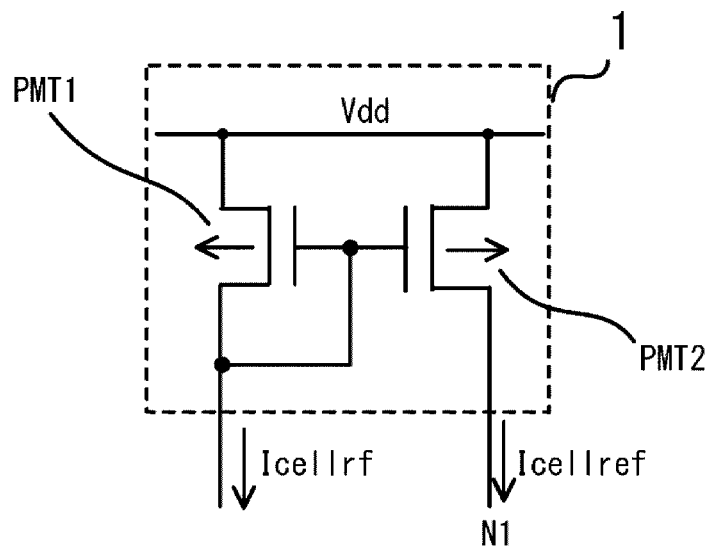
FIG. 4 is a circuit diagram illustrating a current source in the first embodiment.

As illustrated in FIG. 4, the current source 1 is configured with a current mirror circuit. Specifically, the current source 1 includes a P-channel MOS transistor PMT1 and a P-channel MOS transistor PMT2.

One end (source) of the P-channel MOS transistor PMT1 is connected to a high potential side power supply Vdd and the control terminal (gate) is connected to the other end (drain), and a cell reference current ref flows from the other end side. One end (source) of the P-channel MOS transistor PMT2 is connected to the high potential side power supply Vdd and the control terminal (gate) is connected to the control terminal (gate) of the P-channel MOS transistor PMT1, and a reference current Icellref flows from the other end (drain).

A mirror ratio of the P-channel MOS transistor PMT1 and the P-channel MOS transistor PMT2 is equal to 1 when the gate width of P-channel MOS transistor PMT1 divided by the gate length of P-channel MOS transistor PMT1 is equal to the gate width of P-channel MOS transistor PMT2 divided by the gate length of P-channel MOS transistor PMT2. In such a case, then the reference current Icellref is the same as a reference current Icellrf.

Figure 5:
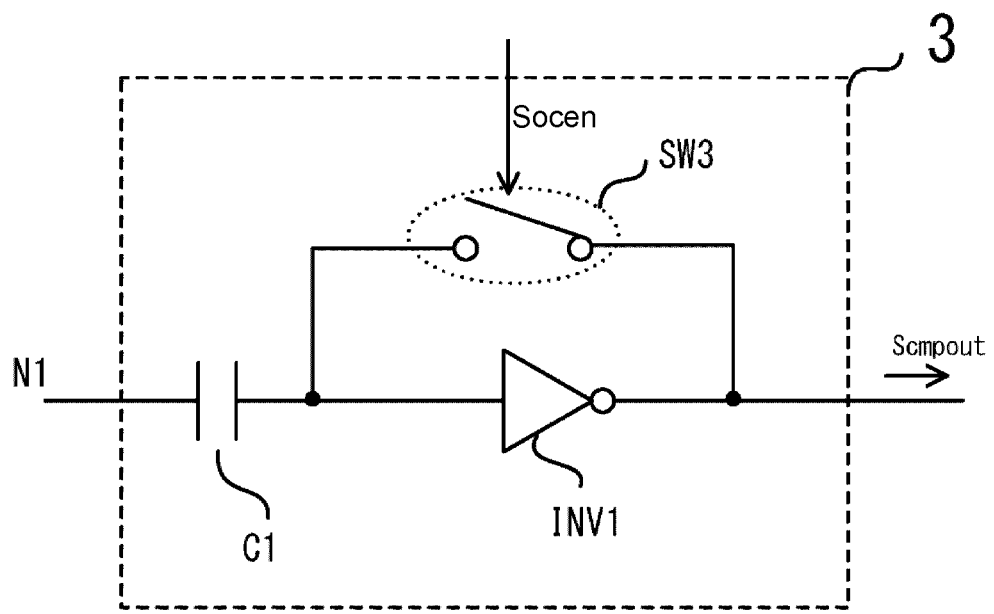
FIG. 5 is a circuit diagram illustrating a sense amplifier in a first embodiment.

As illustrated in FIG. 5, the sense amplifier 3 includes a capacitor C1, inverter INV1, and a switch SW3.

One end of the capacitor C1 is connected to a node N1. One end of the switch SW3 is connected to the other end of the capacitor C1 and to an input side of the inverter INV1, and the other end is connected to an output side of the inverter INV1. The switch SW3 enters an ON state when the sense amplifier reference signal Socen is in an enable state, and thus connects the output side of the inverter INV1 to the input side when closed.

The input side of the inverter INV1 is connected to the capacitor C1 and inverts the data supplied on the input side. When the sense amplifier reference signal Socen is in an enable state, the signal from the output side of the inverter INV1 is fed back to be input to the input side of the inverter INV1. The data stored in the variable resistance element Rcell of the memory cell MC1 is detected by the inverter INV1 and the switch SW3, and is output as the sense amplifier output signal Scmpout.

Figure 6:
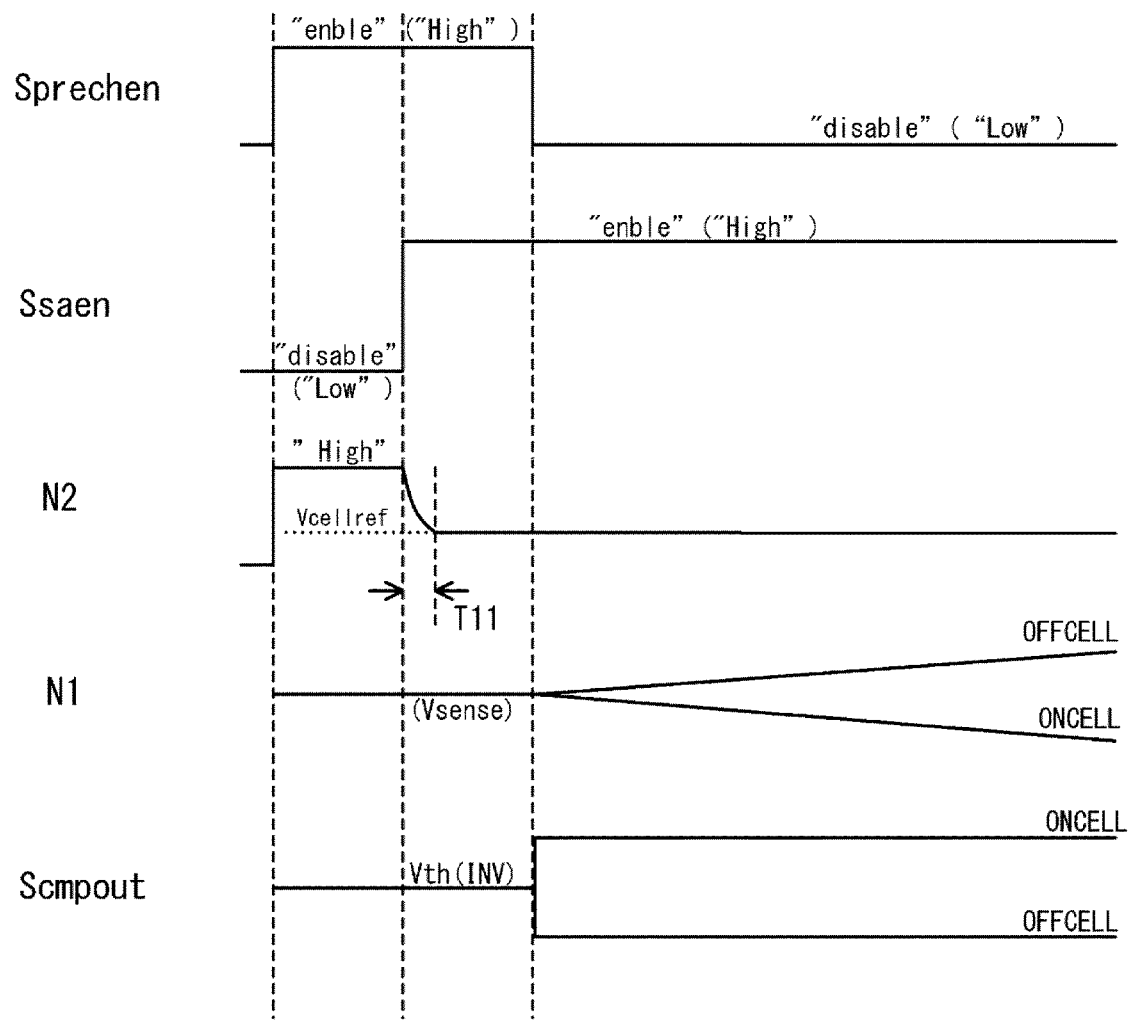
FIG. 6 is a timing chart illustrating a read operation of the memory cell in a first embodiment.

Next, a reading operation of the memory cell will be described with reference to FIG. 6. FIG. 6 is a timing chart illustrating the reading operation of the memory cell.

As illustrated in FIG. 6, when the state of the control signal Sprechen is switched to the high level (hereinafter, referred to as "enable" state) from the low level (hereinafter, referred to as "disable" state), the switch SW1 enters an ON state and sense amplifier reference signal Scmpref is input to the node N1.

While the control signal Sprechen is in the "enable" state, when the state of the control signal Ssaen is switched to the "enable" state from the "disable" state, the switch SW2 enters the ON state and the operation of the clamp circuit 2 starts.

Specifically, when a cell reference voltage Vcellref is input to the amplifier circuit 21 of the clamp circuit 2 as the cell reference signal Scellref, the amplifier circuit 21 compares the cell reference voltage Vcellref and the voltage of the feedback signal Sfd fed back from the node N2, and inputs the comparison amplified signal to the control terminal of the control transistor MT1, and then operates at a high speed such that the voltage at the node N2 becomes the cell reference voltage Vcellref within a short time.

By the operation of the clamp circuit 2, the bit line load capacitor Cbl is rapidly charged and the node N2 (one end side of the bit line load capacitor Cbl) is clamped to the cell reference voltage Vcellref in a charging time T11. That is, the bit line load capacitor Cbl is pre-charged in a short time and one end thereof is rapidly clamped to the cell reference voltage Vcellref.

Here, even if the voltage at the node N2 is close to the cell reference voltage Vcellref, the charging current for charging the bit line load capacitor Cbl does not decrease since the amplifier circuit 21 of the clamp circuit 2 uses a high gain and high speed differential amplifier. Therefore, no trailing occurs in the voltage change at the node N2.

Subsequently, when the control signal Ssaen is in the "enable" state and the state of the control signal Sprechen is switched to the "disable" state from the "enable" state, the supply of the sense amplifier reference signal Scmpref to the node N1 is cut. When the supply of the sense amplifier reference signal Scmpref is cut, the cell current Icell flows from the control transistor MT1 to the memory cell MC1. Although the current source 1 tries to pass the reference current Icellref, it can be determined whether the current is being supplied to the sense amplifier 3 side or the current is being extracted from the sense amplifier 3 side using the magnitudes of the cell current Icell and the reference current Icellref. As a result, reading of the data in the memory cell is started by the sense amplifier 3 with voltage at the node N1 rising or falling.

The detection voltage Vsense at the node N1 gradually decreases in a case where the data value stored in the variable resistance element Rcell has a value of the low resistance state. In contrast, in a case where the data value stored in the variable resistance element Rcell has a value of a high resistance state, the detection voltage Vsense at the node N1 gradually increases.

The sense amplifier 3 detects a change of the detection voltage Vsense at the node N1. In a case where the data stored in the variable resistance element Rcell has the value of the low resistance state, the sense amplifier output signal Scmpout ("high" level) having a voltage higher than a threshold voltage Vth of the inverter INV1 is output. On the contrary, in a case where the data stored in the variable resistance element Rcell has the value of the high resistance state, the sense amplifier output signal Scmpout ("low" level) having a voltage lower than the threshold voltage Vth of the inverter INV1 is output.

Figure 7:
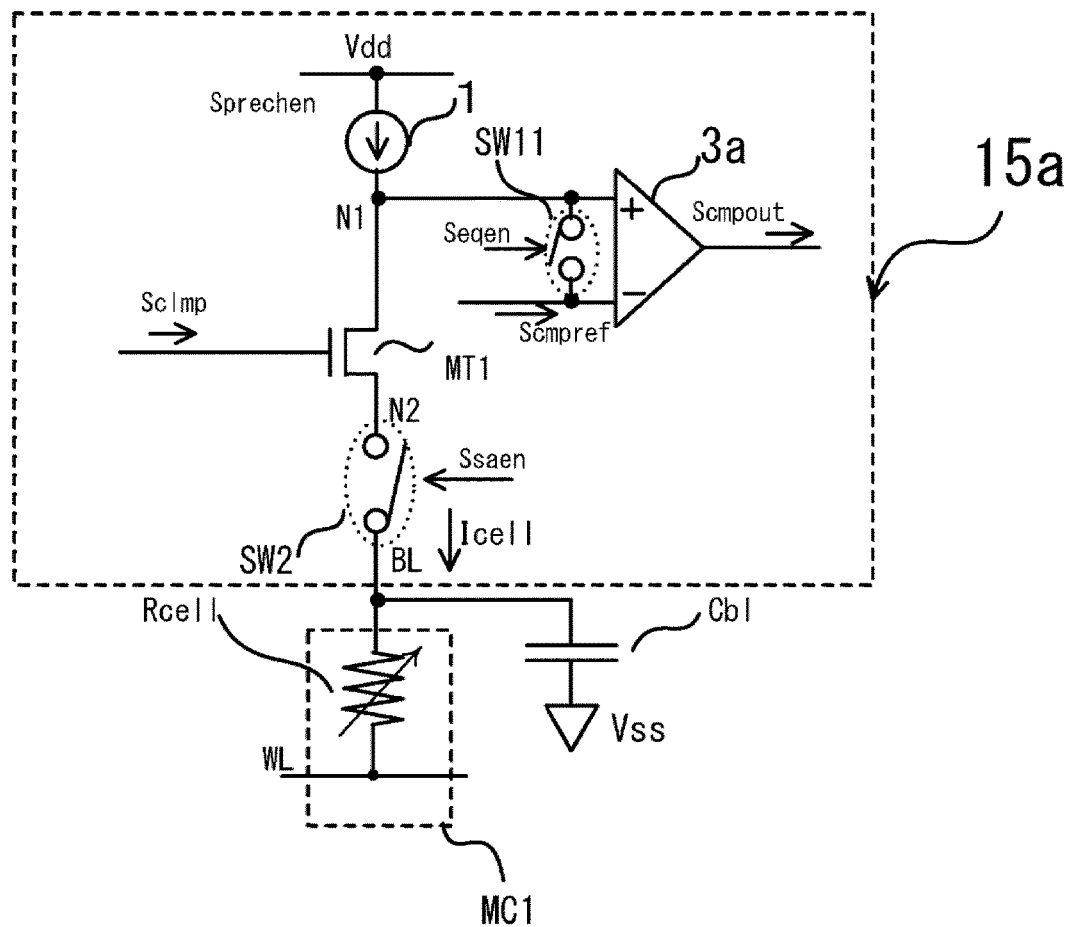
FIG. 7 is a circuit diagram illustrating a write/read circuit in a comparison example.

Next, a clamp circuit of a comparison example will be described with reference to FIG. 7. FIG. 7 is a circuit diagram illustrating a write/read circuit in the comparison example. A non-volatile semiconductor memory device in the comparison example has a structure similar to the non-volatile semiconductor memory device 100 in the first embodiment excepting the write/read circuit structure, and thus only the differences will be discussed.

As illustrated in FIG. 7, a write/read circuit 15a in the comparison example includes a current source 1, a sense amplifier 3a, a control transistor MT1, a switch SW2, and a switch SW11.

One end (e.g., drain) of the control transistor MT1 is connected to the node N1, a control signal Sclmp is input to the control terminal (e.g., gate), and the other end (e.g., source) is connected to the node N2. The control transistor MT1 clamps the node N2 to become a voltage equal to the clamp signal Sclmp minus the threshold voltage (Vth) of the control transistor MT1.

The cell current Icell flows in the bit line BL during the reading operation of the memory cell MC1.

One end of the switch SW11 is connected to the node N1, and the sense amplifier reference signal Scmpref is input to the other end. The switch SW11 enters an ON state when an equalize signal Seqen is in the "enable" state.

A positive (+) port of the input side of the sense amplifier 3a is connected to the node N1, the sense amplifier reference signal Scmpref is input to a negative port (−) of the input side thereof. The sense amplifier 3a detects data stored in the variable resistance element Rcell of the memory cell MC1, and outputs the data as the sense amplifier output signal Scmpout.

Figure 8:
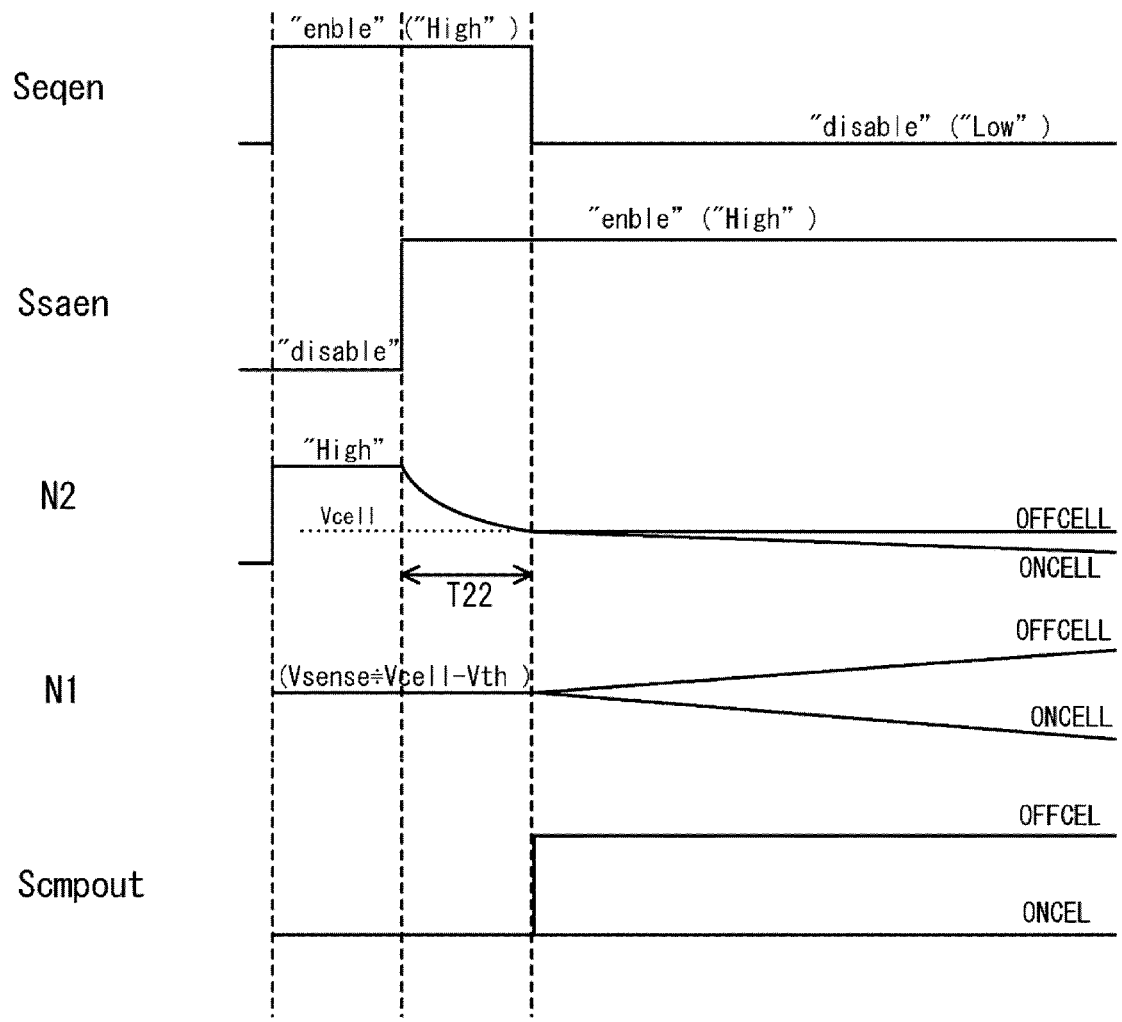
FIG. 8 is a timing chart illustrating a read operation of a memory cell in the comparison example.

Next, the reading operation of the memory cell in the comparison example will be described with reference to FIG. 8. FIG. 8 is a timing chart illustrating the read operation of the memory cell in the comparison example.

As illustrated in FIG. 8, when the state of the equalize signal Seqen is switched to the "enable" state from the "disable" state, the switch SW11 enters an ON state.

Next, when the equalize signal Seqen is maintained to be in the "enable" state and the state of the control signal Ssaen is changed to the "enable" state from the "disable" state, the bit line load capacitor Cbl begins to be charged.

In the comparison example, the control transistor MT1 tries to set the node N2 to a voltage equal to the voltage of the control signal Sclmp minus the threshold voltage (Vth) of the control transistor MT1. Incidentally, as the voltage at the node N2 is close to the above-described voltage, the control transistor MT1 is close to the OFF state, and thus, the charging current decreases and the charging time T22 for charging up to a certain voltage increases.

Therefore, it is necessary to set the duration time of the "enable" state of the equalize signal Seqen to be long.

Subsequently, when the control signal Ssaen is maintained to be in the "enable" state and the state of the equalize signal Seqen is changed to the "disable" state from the "enable" state, the electric charges charged in the bit line load capacitor Cbl are gradually discharged, and reading of the data in the memory cell is started by the sense amplifier 3a.

In a case where the data stored in the variable resistance element Rcell has a value of a low resistance state, the detection voltage Vsense at the node N1 gradually decreases. When the data stored in the variable resistance element Rcell has a value of a high resistance state, the detection voltage Vsense at the node N1 gradually increases.

The sense amplifier 3a inputs the detection voltage Vsense at the node N1 to the positive (+) port of the input side, inputs the voltage of the sense amplifier reference signal Scmpref, performs comparison calculation processing, and outputs the comparison result as the sense amplifier output signal Scmpout.

When the data stored in the variable resistance element Rcell has a value of the low resistance state, the sense amplifier output signal Scmpout becomes lower than the sense amplifier reference signal Scmpref, therefore, the sense amplifier output signal Scmpout of low level is output. When the data stored in the variable resistance element Rcell has the value of the high resistance state, the sense amplifier output signal Scmpout becomes higher than the sense amplifier reference signal Scmpref, therefore, the sense amplifier output signal Scmpout of high level is output.

In the non-volatile semiconductor memory device in the comparison example, the duration (equalizing time) of the "enable" state of the equalize signal Seqen becomes long, and thus, the charging time T22 for charging the bit line load capacitor Cbl becomes long as well.

In the non-volatile semiconductor memory device 100 of the first embodiment, the charging time T11 does not depend on the bit line load capacitor Cbl and the cell current. However, in the non-volatile semiconductor memory device in the comparison example, the charging time T22 depends on the bit line load capacitor Cbl and the cell current.

Figure 9:
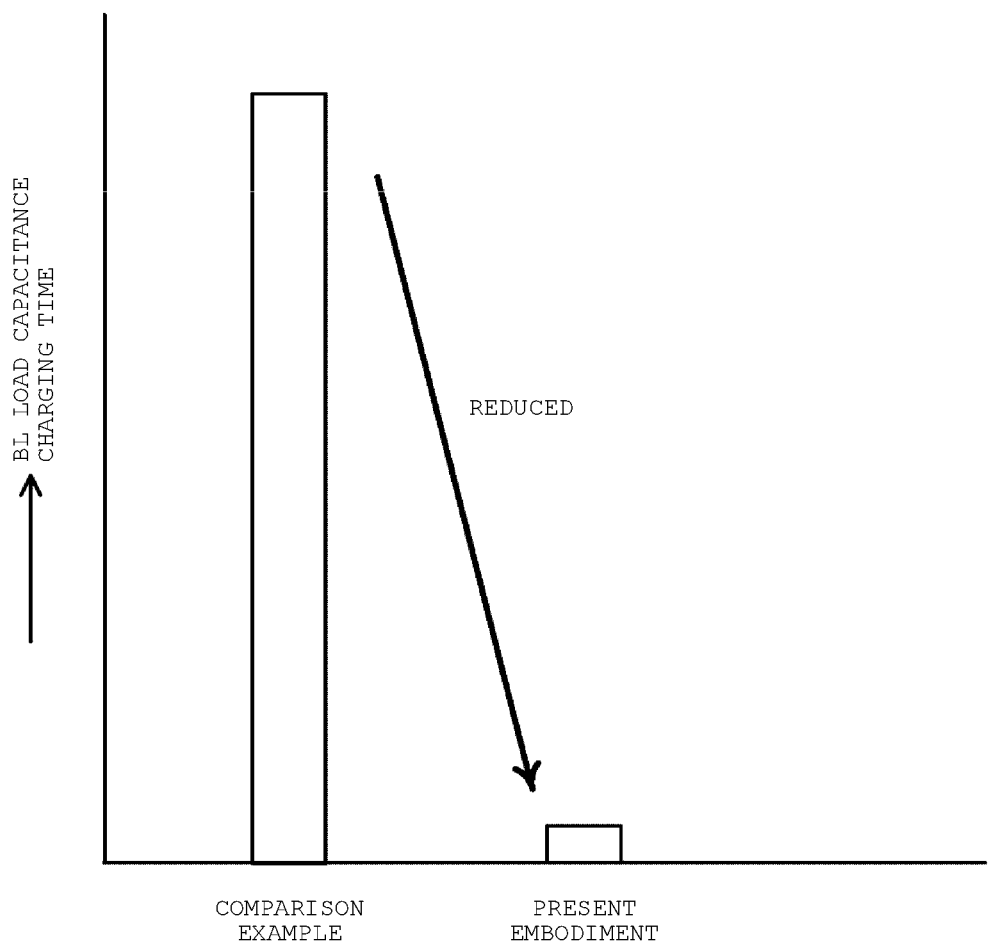
FIG. 9 is a diagram illustrating a bit line load capacitor charging time in a first embodiment.

Next, bit line load capacitor charging time of a non-volatile semiconductor memory device will be described with reference to FIG. 9. FIG. 9 is a diagram illustrating a bit line load capacitor charging time.

As illustrated in FIG. 9, the charging time of the non-volatile semiconductor memory device 100 of the first embodiment is significantly shortened compared to that of the non-volatile semiconductor memory device of the comparison example. The charging time T11 in the first embodiment depends on the speed of the amplifier circuit 21 and the current consumption. If the speed of the amplifier circuit 21 is increased, the charging time T11 can be shortened, and if the current consumption is increased, the charging time T11 can be shortened.

As described above, in the non-volatile semiconductor memory device in the first embodiment, there is provided the write/read circuit 15 that includes the current source 1, the clamp circuit 2, the sense amplifier 3, the switch SW1, and the switch SW2. The write/read circuit 15 is connected to the memory cell MC1 via a bit line BL. The clamp circuit 2 includes the control transistor MT1 and the amplifier circuit 21. The amplifier circuit 21 compares the cell reference signal Scellref with the feedback signal Sfd fed back from the node N2, and outputs the comparison amplified signal to the control terminal of the control transistor MT1. The clamp circuit 2 rapidly charges the bit line load capacitor Cbl and clamps the node N2 at the cell reference voltage Vcellref in a short time.

Therefore, the charging time T11 of the bit line load capacitor Cbl can be shortened, and furthermore, the charging time T11 does not depend on the bit line load capacitor Cbl and the cell current Icell. Therefore, it is possible to achieve high speed data reading operations on the memory cell MC1.

In the first embodiment, the non-volatile semiconductor memory device is a ReRAM, but the disclosure is not necessarily limited thereto. For example, the non-volatile semiconductor memory device can also be applied to a PCRAM or an MRAM, which both incorporate a variable resistance element.

Second Embodiment

Figure 10:
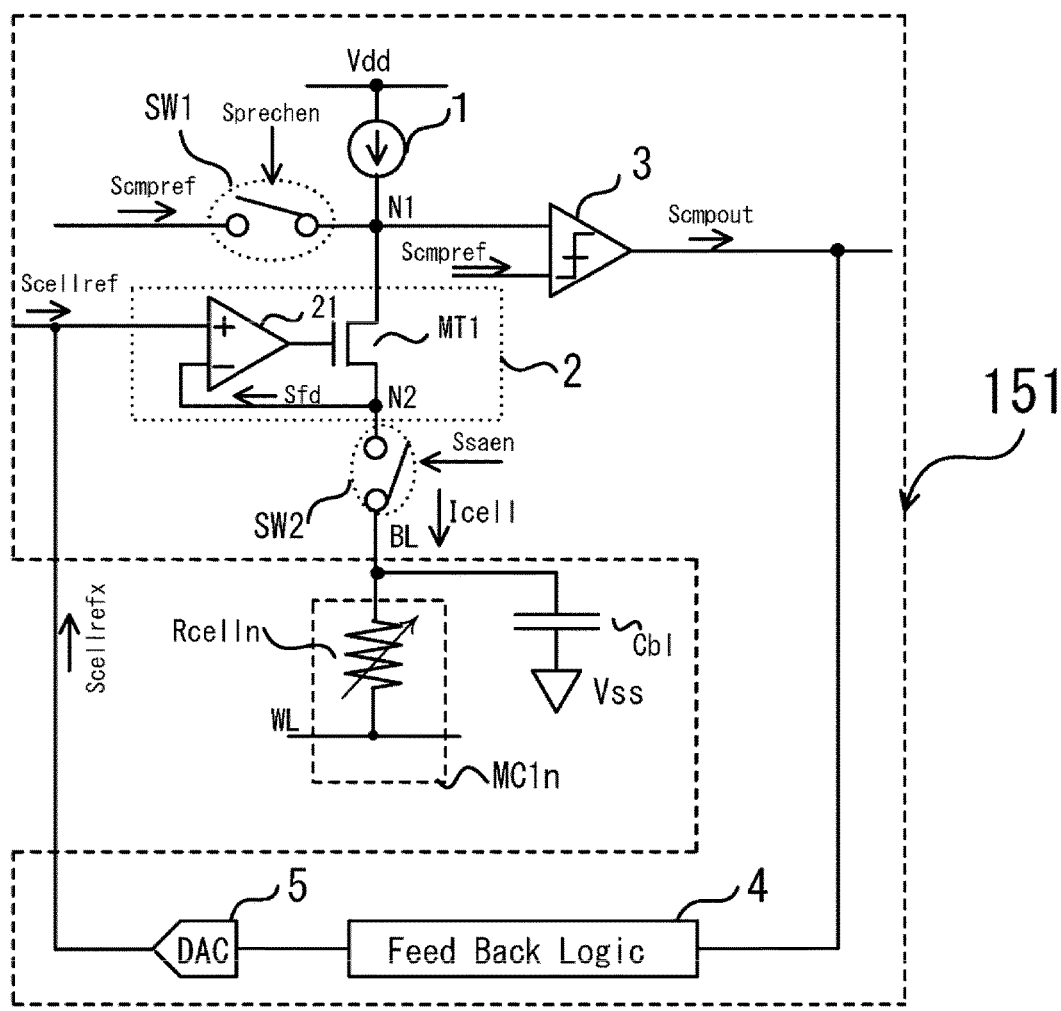
FIG. 10 is a circuit diagram illustrating a write/read circuit in a second embodiment.

Next, a non-volatile semiconductor memory device of a second embodiment will be described with reference to the drawings. FIG. 10 is a circuit diagram illustrating a write/read circuit. In the second embodiment, both high-speed charging of the bit line load capacitor and high-speed reading of multilevel memory cell data can be achieved using a clamp circuit, a determination circuit, and a DA (digital-analog) converter.

Hereinafter, the same reference numerals will be given to the same configuration elements as those of the first embodiment, and the description of repeated elements will be omitted, and differences in elements will be described.

As illustrated in FIG. 10, a write/read circuit 151 in the non-volatile semiconductor memory device in the second embodiment includes a current source 1, a clamp circuit, a sense amplifier 3, a determination circuit 4, a DA converter 5, a switch SW1, and a switch SW2.

The write/read circuit 151 is connected to a memory cell MC1n via a bit line BL. The memory cell MC1n includes a variable resistance element Rcelln in which multilevel data can be stored. One end of the variable resistance element Rcelln is connected to the bit line BL and the other end is connected to the word line WL.

A cell current Icell flows in the bit line BL during the read operation of the memory cell MC1n.

Figure 11A:
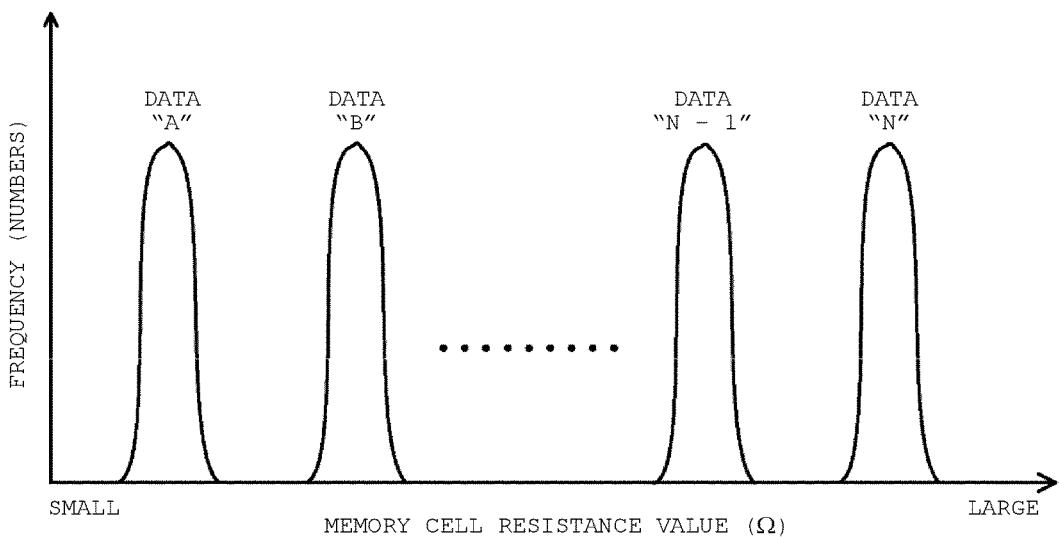
FIG. 11A and FIG. 11B are diagrams illustrating variable resistance elements having multilevel data in a second embodiment.

As illustrated in FIG. 11A, the multilevel data of the variable resistance-change element Rcelln is divided into n data groups (here, n is an integer equal to greater than 2) for which the memory cell resistance values are different from each other such as a data "A" group, a data "B" group . . . a data "N−1" group, and a data "N" group. Each group is distinct from each other.

Figure 11B:
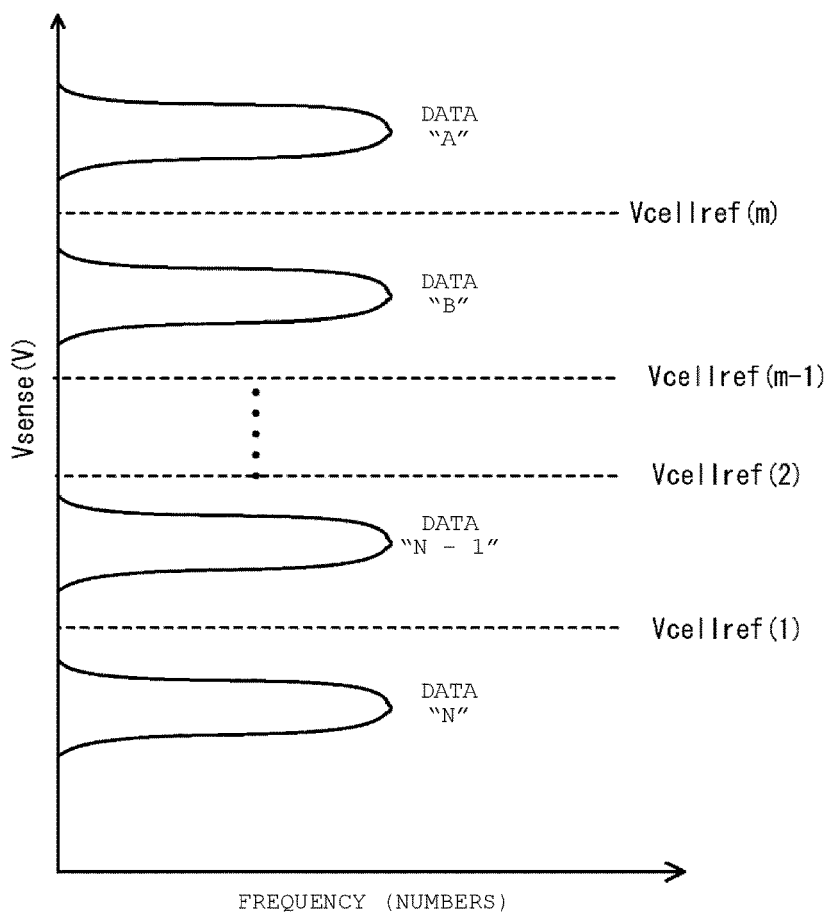

Relationships between a detection voltage Vsense at the node N1, the multilevel data of the variable resistance element Rcelln, and the cell reference voltage Vcellref can be as illustrated in FIG. 11B. For example, a cell reference voltage Vcellref(1) is between the data "N−1" group and the data "N" group voltage levels. A cell reference voltage Vcellref(2) is between the data "N−2" group (not specifically illustrated) and the data "N−1" group voltage levels. A cell reference voltage Vcellref (m−1) is between the data "B" group and the data "C" group (not specifically illustrated). A cell reference voltage Vcellref(m) is between the data "A" group and the data "B" group voltage levels.

Here, the variable resistance element Rcelln of the memory cell in the data "N" group is, for example, in the high resistance state. For example, resistance reduction processing is performed on the variable resistance element Rcelln of the memory cells in the data "A" group, the data "B" group, . . . , data "N−1" group, and the state of the variable resistance element Rcelln is changed and thus, the resistance value is changed.

The determination circuit 4 receives the sense amplifier output signal Scmpout which is data information of the variable resistance element Rcelln detected by the sense amplifier 3. The determination circuit 4 detects whether or not the data information stored in the variable resistance element Rcelln of the memory cell MC1n is in one of the groupings of data groups illustrated in FIG. 11. For example, the data "A" group, the data "B" group . . . the data "k−1" group are assigned to a first group of data groups, and the data "k−1" group . . . the data "N−1" group, and the data "N" group are assigned to a second group of data groups. Based on the determination result, the grouping in which the data information stored in the variable resistance element Rcelln is included, is divided again into two, and then, the cell reference voltage Vcellref is changed. The determination processing by the determination circuit 4 and the changing processing of the cell reference voltage Vcellref or the like are based on digital calculation processing.

The DA converter 5 is provided between the determination circuit 4 and the positive (+) port of the input side of the amplifier circuit 21. Based on the output signal output from the determination circuit 4, the DA converter 5 outputs a changed cell reference signal Scellrefx, which is an analog signal, to the positive (+) port of the input side of the amplifier circuit 21 as a feedback signal. Here, at the first read operation, the cell reference signal Scellref is input to the positive (+) port of the input side of the amplifier circuit 21.

Figure 12:
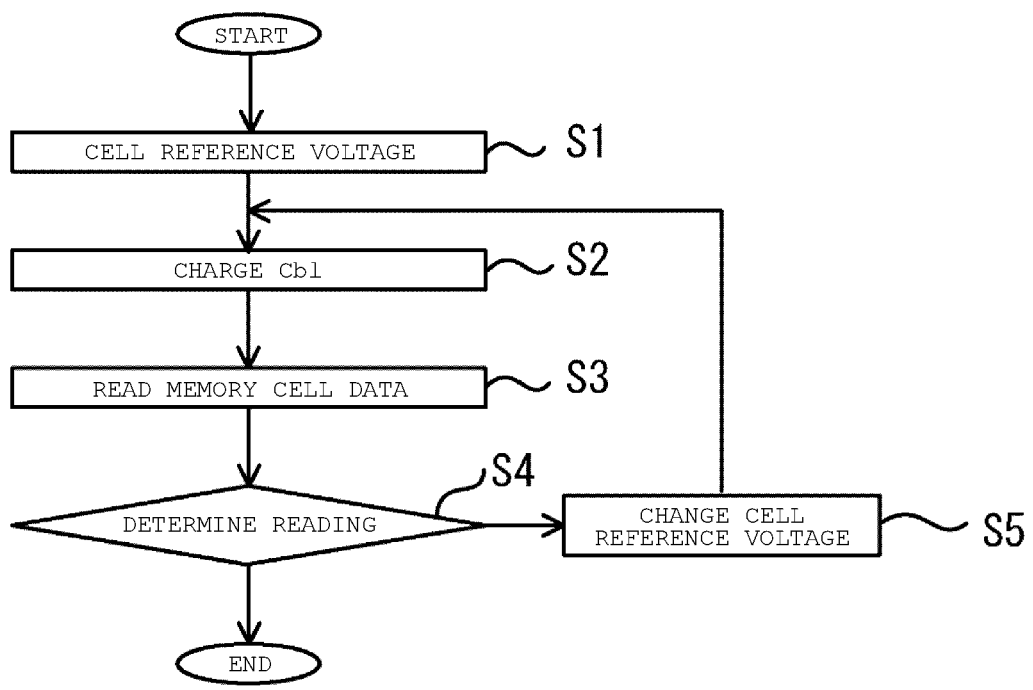
FIG. 12 is a flowchart illustrating the read operation of the memory cell in a second embodiment.

Next, the reading operation of the memory cell of the non-volatile semiconductor memory device in the second embodiment will be described with reference to FIG. 12. FIG. 12 is a flowchart illustrating the reading operation of the memory cell.

As illustrated in FIG. 12, first, the control signal Sprechen is set to be in the "enable" state to make the switch SW1 enter an ON state, and the sense amplifier reference signal Scmpref is input to the node N1. The control signal Ssaen is set to be in the "enable" state to make the switch SW2 enter an ON state, and the cell reference voltage Vcellref is input to the positive port of the input side of the amplifier circuit 21 in the clamp circuit 2. Here, as illustrated in FIG. 11B, in selecting the cell reference voltage Vcellref, it is preferable to select the cell reference voltage close to the data group in which the memory cell resistance value is distributed in the center value (step S1).

When the switch SW2 enters an ON state and the cell reference voltage Vcellref is input, the clamp circuit 2 starts the operation and charges the bit line load capacitor Cbl in a short time, and clamps the node N2 at the cell reference voltage Vcellref (step S2).

When the switch SW1 enters an OFF state, the voltage at the node N1 depending on the magnitudes of the cell current Icell and the reference current Icellref, and the sense amplifier 3 starts the operation and outputs the sense amplifier output signal Scmpout (step S3).

The determination circuit 4 receives the sense amplifier output signal Scmpout and determines whether or not the data stored in the variable resistance element Rcelln of the memory cell MC1n is present in any one of the two groups of data groups (step S4).

In the next step, the determination circuit 4 divides the two groups of data groups into two groups again, and the cell reference voltage Vcellref is changed. Based on the result of determination by the determination circuit 4, the DA converter 5 outputs a changed cell reference voltage Vcellrefx which is analog data to the positive (+) port of the input side of the amplifier circuit 21 as a feedback signal (step S5).

The determination circuit 4 performs the determination processing N times until it can be determined in which data group illustrated in FIG. 11B that the data stored in the variable resistance element Rcelln is included, and the closest data group is determined.

As described above, in the non-volatile semiconductor memory device in the present embodiment, the write/read circuit 151 that includes the current source 1, the clamp circuit, the sense amplifier 3, the determination circuit 4, the DA converter 5, the switch SW1, and the switch SW2, is provided. The write/read circuit 151 is connected to the memory cell MC1n via the bit line BL. The memory cell MC1n includes the variable resistance element Rcelln in which the multilevel data can be stored. One end of the variable resistance element Rcelln is connected to the bit line BL, and the other end is connected to the word line WL. The determination circuit 4 receives the sense amplifier output signal Scmpout and determines the data group in which the data information stored in the variable resistance element Rcelln of the memory cell MC1n is present. In the determination, for example, the comparison is performed N times (where N is equal to or greater than 2). The DA converter 5 outputs the changed cell reference signal Scellrefx to the positive (+) port of the input side of the amplifier circuit 21 as a feedback signal. By determining the data group in which the data information is present N times, it is possible to specify the particular group in which the data information is present.

Therefore, both the high-speed charging of the bit line load capacitor and the high-speed reading of the multilevel memory cell data can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device, comprising:
    a current source providing a reference current to a first node;
    a clamp circuit including:
        a control transistor having a current path with a first end connected to the first node and a second end connected to a second node, and
        an amplifier circuit with a first input port at which a cell reference voltage can be received, a second input port connected to the second node, and an output port connected to a control terminal of the control transistor, the amplifier circuit being configured to output a differentially amplified signal from the output port;
    a memory cell connected between a bit line and a word line and including a variable resistance element, the bit line being connectable to the second node;
    a sense amplifier connected to the first node and configured to detect a data value stored in the memory cell according to a resistance level of the variable resistance element;
    a first switch between the first node and a first reference voltage source, the first switch being configured to connect the first node to the first reference voltage source when a first control signal provided thereto is in an enable state; and
    a second switch between the second node and the bit line, the second switch being configured to connect the second node to the bit line when a second control signal provided thereto is in an enable state.

2. The non-volatile semiconductor memory device according to claim 1, wherein
    the sense amplifier includes a capacitor, an inverter, and a third switch, and
    the capacitor is connected between the first node and an input side of the inverter,
    a first end of the third switch is connected a node between the capacitor and the input side of the inverter and the capacitor,
    a second end of the third switch the output side of the inverter, and
    when the third switch is closed, the third switch connects the node between the capacitor and the input side of the inverter to the output side of the inverter to feed an output signal of the inverter back to the input side of the inverter.

3. The non-volatile semiconductor memory device according to claim 1, wherein the variable resistance element stores a plurality of data items as multilevel data items at resistance value distributions that are different from each other.

4. The non-volatile semiconductor memory device according to claim 3, further comprising:
   a determination circuit configured to receive an output signal from the sense amplifier and change the cell reference voltage according to the output signal from the sense amplifier; and
   a digital-to-analog converter that outputs a voltage for changing the cell reference voltage according to the determination circuit.

5. The non-volatile semiconductor memory device according to claim 1, wherein the memory cell is one of a resistive random access memory (ReRAM)-type, a phase-change random access memory (PCRAM)-type, or a magneto-resistive random access memory (MRAM)-type.

6. The non-volatile semiconductor memory device according to claim 1, wherein the current source includes a current mirror circuit.

7. The non-volatile semiconductor memory device according to claim 6, wherein the current mirror circuit comprises two p-channel metal-oxide-semiconductor transistors.

8. The non-volatile semiconductor memory device according to claim 7, wherein a ratio of gate width to gate length is the same for the two p-channel metal-oxide semiconductor transistors.

9. A non-volatile semiconductor memory device, comprising:
   a memory cell array including a memory cell connected between a bit line and a word line, the memory cell including variable resistance element for storing data;
   a write-read circuit connected to the memory cell array for writing and reading data according to commands from an external host;
   an address decoder for controlling selection of the bit line and selection of the word line according to the commands from the external host;
   a controller configured to control the write-read circuit and the address decoder according to the commands from the external host, wherein
   the write-read circuit includes:
      a current source providing a reference current to a first node;
      a clamp circuit including:
         a control transistor having a current path with a first end connected to the first node and a second end connected to a second node to which the bit line can be connected, and
         an amplifier circuit with a first input port at which a cell reference voltage can be received, a second input port connected to the second node, and an output port connected to a control terminal of the control transistor, the amplifier circuit being configured to output a differentially amplified signal from the output port; and
      a sense amplifier connected to the first node and configured to detect a data value stored in the memory cell according to a resistance level of the variable resistance element;
   a first switch between the first node and a first reference voltage source, the first switch being configured to connect the first node to the first reference voltage source when a first control signal provided thereto from the controller is in an enable state; and
   a second switch between the second node and the bit line, the second switch being configured to connect the second node to the bit line when a second control signal provided thereto from the controller is in an enable state.

10. The non-volatile semiconductor memory device according to claim 9, wherein
   the sense amplifier includes a capacitor, an inverter, and a third switch, and
   the capacitor is connected between the first node and an input side of the inverter,
   a first end of the third switch is connected a node between the capacitor and the input side of the inverter and the capacitor,
   a second end of the third switch is connected to the output side of the inverter, and
   when the third switch is closed, the third switch connects the node between the capacitor and the input side of the inverter to the output side of the inverter to feed an output signal of the inverter back to the input side of the inverter.

11. The non-volatile semiconductor memory device according to claim 9, wherein the variable resistance element stores a plurality of data items as multilevel data items at resistance value distributions that are different from each other.

12. The non-volatile semiconductor memory device according to claim 11, further comprising:
   a determination circuit configured to receive an output signal from the sense amplifier and change the cell reference voltage according to the output signal from the sense amplifier; and
   a digital-to-analog converter that outputs a voltage for changing the cell reference voltage according to the determination circuit.

13. The non-volatile semiconductor memory device according to claim 9, wherein the memory cell is one of a resistive random access memory (ReRAM)-type, a phase-change random access memory (PCRAM)-type, or a magneto-resistive random access memory (MRAM)-type.

14. The non-volatile semiconductor memory device according to claim 9, wherein the current source includes a current mirror circuit.

15. A non-volatile semiconductor memory device, comprising:
   a current source including a current mirror circuit and providing a reference current to a first node;
   a clamp circuit including:
      a control transistor having a current path with a first end connected to the first node and a second end connected to a second node, and
      an amplifier circuit with a first input port at which a cell reference voltage can be received, a second input port connected to the second node, and an output port connected to a control terminal of the control transistor, the amplifier circuit being configured to output a differentially amplified signal from the output port;
   a memory cell connected between a bit line and a word line and including a variable resistance element, the bit line being connectable to the second node;
   a sense amplifier connected to the first node and configured to detect a data value stored in the memory cell according to a resistance level of the variable resistance element, the sense amplifier including a capacitor and an inverter connected in series and a first switch on a direct path between an input side of the inverter and an output side of the inverter when closed;

a second switch between the first node and a first reference voltage source, the second switch being configured to connect the first node to the first reference voltage source when a first control signal provided thereto is in an enable state; and a third switch between the second node and the bit line, the third switch being configured to connect the second node to the bit line when a second control signal provided thereto is in an enable state.

16. The non-volatile semiconductor memory device according to claim 15, further comprising:

a determination circuit configured to receive an output signal from the sense amplifier and change the cell reference voltage according to the output signal from the sense amplifier; and a digital-to-analog converter that outputs a voltage for changing the cell reference voltage according to the determination circuit.

17. The non-volatile semiconductor memory device according to claim 15, wherein the memory cell is one of a resistive random access memory (ReRAM)-type, a phase-change random access memory (PCRAM)-type, or a magneto-resistive random access memory (MRAM)-type.

18. The non-volatile semiconductor memory device according to claim 15, wherein the variable resistance element stores a plurality of data items as multilevel data items at resistance value distributions that are different from each other.

19. A non-volatile semiconductor memory device, comprising:

a current source providing a reference current to a first node;

a clamp circuit including:

a control transistor having a current path with a first end connected to the first node and a second end connected to a second node, and an amplifier circuit with a first input port at which a cell reference voltage can be received, a second input port connected to the second node, and an output port connected to a control terminal of the control transistor, the amplifier circuit being configured to output a differentially amplified signal from the output port;

a memory cell connected between a bit line and a word line and including a variable resistance element, the bit line being connectable to the second node;

a sense amplifier connected to the first node and configured to detect a data value stored in the memory cell according to a resistance level of the variable resistance element;

a determination circuit configured to receive an output signal from the sense amplifier and change the cell reference voltage according to the output signal from the sense amplifier; and a digital-to-analog converter that outputs a voltage for changing the cell reference voltage according to the determination circuit, wherein the variable resistance element stores a plurality of data items as multilevel data items at resistance value distributions that are different from each other.

20. The non-volatile semiconductor memory device according to claim 19, wherein the memory cell is one of a resistive random access memory (ReRAM)-type, a phase-change random access memory (PCRAM)-type, or a magneto-resistive random access memory (MRAM)-type.

* * * * *